US007745521B2

(12) United States Patent
Schneider et al.

(10) Patent No.: US 7,745,521 B2
(45) Date of Patent: Jun. 29, 2010

(54) ACOUSTIC WAVEGUIDE PLATE

(75) Inventors: John K. Schneider, Snyder, NY (US); Jack C. Kitchens, Tonawanda, NY (US)

(73) Assignee: Ultra-Scan Corporation, Amherst, NY (US)

( * ) Notice: Subject to any disclaimer, the term of this patent is extended or adjusted under 35 U.S.C. 154(b) by 290 days.

(21) Appl. No.: 11/761,101

(22) Filed: Jun. 11, 2007

(65) Prior Publication Data

US 2007/0297739 A1 Dec. 27, 2007

Related U.S. Application Data

(60) Provisional application No. 60/804,412, filed on Jun. 9, 2006.

(51) Int. Cl.
*C08K 5/15* (2006.01)
*G02B 6/10* (2006.01)
*H03H 9/00* (2006.01)

(52) U.S. Cl. ........................ 524/114; 385/129; 333/143

(58) Field of Classification Search .................. 524/114
See application file for complete search history.

(56) References Cited

U.S. PATENT DOCUMENTS

| | | | | |
|---|---|---|---|---|
| 4,012,650 | A | 3/1977 | Pratt et al. | |
| 4,077,023 | A | 2/1978 | Boyd et al. | |
| 4,742,318 | A | 5/1988 | Jen et al. | |
| 4,743,870 | A | 5/1988 | Jen et al. | |
| 5,005,005 | A | 4/1991 | Brossia et al. | |
| 5,596,671 | A * | 1/1997 | Rockwell, III | 385/147 |
| 5,828,274 | A * | 10/1998 | Jen et al. | 333/143 |
| 2003/0053936 | A1* | 3/2003 | Potyrailo et al. | 422/82.11 |
| 2003/0073904 | A1 | 4/2003 | Moriya et al. | |
| 2006/0072875 | A1 | 4/2006 | Bhagavatula et al. | |
| 2008/0219098 | A1 | 9/2008 | Schneider et al. | |

FOREIGN PATENT DOCUMENTS

| | | | |
|---|---|---|---|
| WO | WO 2008/036444 | A2 | 3/2008 |
| WO | WO 2008/066956 | A2 | 6/2008 |

OTHER PUBLICATIONS

Jen; Acoustic Fibers; 1987 IEEE; 1987 Ultrasonics Symposium; pp. 443-454.

Jen, et al.; Clad polymer buffer rods for polymer process monitoring; Ultrasonics 39 (2001); pp. 81-89.

Legros, et al.; Ultrasonic evaluation and application of oriented polymer rods; Ultrasonics 37 (1999); pp. 291-297.

Verdonk; Measurements of Pulse Mode Behavior in Weakly-Clad Silica Waveguides; 1996 IEEE Ultrasonics Symposium; pp. 723-726.

Industrial Materials Institute / National Research Council; Flexible Piezoelectric/Ultrasonic Sensors for Biomedical Applications; Industrial Materials Institute / National Research Council; 1 page.

Industrial Materials Institute / National Research Council; Integrated (IUT) and Flexible Ultrasonic Transducers (FUTs) Technology for Real-Time On-site Nondestructive Evaluation; Industrial Materials Institute / National Research Council; 1 page.

UK IPO Search Report for Application No. GB0810621.3, Oct. 7, 2008, Ultra-Scan Corporation.

International Search Report and Written Opinion for PCT/US2007/070873, Apr. 4, 2008, Ultra-Scan Corporation.

Jen; Similarities and Differences Between Fiber Acoustics and Fiber Optics; 1985 Ultrasonics Symposium; 1985 IEEE; pp. 1128-1133.

Jen et al.; Leaky Modes in Weakly Guiding Fiber Acoustic Waveguides; IEEE Transactions on Ultrasonics, Ferroelectrics, and Frequency Control, vol. UFFC-33, No. 6, Nov. 1986; pp. 634-643.

* cited by examiner

*Primary Examiner*—Ling-Siu Choi
*Assistant Examiner*—Hui Chin
(74) *Attorney, Agent, or Firm*—Hodgson Russ LLP

(57) ABSTRACT

An acoustic (sound or ultrasound) wave transmitter having a plurality of waveguides is described, and a method of making such a transmitter is described. Each waveguide may have a cladded core. The cladded core is capable of transmitting acoustic wave energy from a first end surface to a second end surface of the cladded core. The waveguides may be substantially fixed relative to each other by a binder. The binder may be formed by fusing the claddings together, potting a material between the waveguides and/or mechanically holding the waveguides.

18 Claims, 5 Drawing Sheets

ISOMETRIC VIEW
FIBER PITCH
DETAIL
CLADDING
CORE
8
10
1
2
3
4
B
L
H

SEPARATE FIBERS WITH CORE & CLADDING

FIBERS WITH CORE & CLADDING UNDERGOING FUSING

FULLY FUSED FIBERS WITH CORE INTACT & CLADDING NOW CONTINUOUS

SEPARATE FIBERS WITH CORE & CLADDING

SEPARATE FIBERS WITH CORE & CLADDING BUT WITH CONTINUOUS POTTING MATERIAL
5
1
6
4
3

ACOUSTIC WAVEGUIDE PLATE

CROSS-REFERENCE TO RELATED APPLICATION

This application claims the benefit of priority to U.S. provisional patent application Ser. No. 60/804,412, filed on Jun. 9, 2006.

FIELD OF THE INVENTION

The present invention relates to devices for transmitting information using longitudinal waves, such as sound and ultrasound. The term "acoustic" is used to refer collectively to sound waves and ultrasound waves.

BACKGROUND OF THE INVENTION

It is well known to use acoustic waves, such as ultrasonic energy, to determine information about an object. For example, in non-destructive testing, ultrasonic energy pulses are used to determine whether flaws exist in an object without damaging the object. Ultrasonic energy pulses are also used to obtain information about the friction ridge surfaces, such as fingerprints, of human beings.

To use an ultrasonic energy pulse to obtain information, the pulse must be sent from a device (the "emitter") that is suitable for emitting ultrasonic energy pulses toward an object to be analyzed, and there must be a device (the "receiver") that is suitable for receiving the energy once it has been reflected by or passed through the object. For ease of description, we will discuss the situation in which ultrasonic energy is reflected, but it will be recognized that this description (and the invention) can be applicable to situations in which the detected ultrasonic energy passes through the object being analyzed. Furthermore, in order to illustrate the concepts and ideas, the object being analyzed is from time to time described as a fingerprint, but it will be recognized that this description (and the invention) is not limited to fingerprints.

When the object being analyzed is a fingerprint, a single device may be used to serve as both the emitter and the receiver. Usually, the emitter and the receiver are positioned some distance from the object being analyzed, and so the emitted ultrasonic energy and the reflected ultrasonic energy must travel through a transmittive substance. Air is a transmittive substance for ultrasonic energy, but other substances transmit ultrasonic energy better than air. One such transmittive substance is mineral oil. Regardless of the choice of transmittive substance, the strength of the ultrasonic energy pulse is weakened and scattered as it passes through the transmittive substance. The result is that by the time the ultrasonic energy arrives at the receiver, the strength of the pulse has greatly diminished.

As a result of scattering caused by the transmittive substance, some of the ultrasonic energy reflected from one part of an object will arrive at a portion of the receiver that is intended for receiving ultrasonic energy from another part of the object. Such scattering tends to reduce the clarity of the information provided by an ultrasonic system.

Traditionally, plastic lenses have been used to collect and focus ultrasonic energy from the image plane of a target object to another image plane where an ultrasonic receiver converts the ultrasonic energy to an electric signal, which then can be used to generate a visual representation of the object. The primary drawbacks in this methodology have been (a) large lens size, and (b) the inability to create short transmission paths for transferring the ultrasonic energy.

Additionally, compound lens assemblies must frequently be fabricated to tight mechanical tolerances, which results in increased costs.

The prior art ultrasonic systems would be made more effective if there was a way to transmit ultrasonic energy that had less attenuation of the ultrasonic energy pulse and/or prevented scattering of the ultrasonic energy pulse.

SUMMARY OF THE INVENTION

The invention may be embodied as an acoustic wave transmitter having a plurality of waveguides. Although this document focuses on ultrasound, this is done to illustrate how the invention might be implemented. The invention is not limited to ultrasound, and it should be recognized that other acoustic waves may be used.

Each waveguide may have a core and cladding. The core may have a first end surface, a second end surface, and a longitudinal surface extending between the first and second end surfaces. The longitudinal surface of the core may be substantially surrounded by the cladding to form a cladded core. The cladded core is capable of transmitting ultrasonic energy from the first end surface to the second end surface.

The waveguides may be substantially fixed relative to each other by a binder. The binder may be formed by fusing the claddings together, potting a material between the waveguides and/or mechanically holding the waveguides.

The core may be a material having a first shear-wave propagation velocity ("SWPV"). The cladding may be a material having a second shear-wave propagation velocity, and the first SWPV is different from the second SWPV. The second SWPV may be greater than the first SWPV.

The invention may be embodied as a method of making an acoustic wave transmitter. In one such method, a plurality of waveguides are provided. Each wave guide has a core and cladding. The core has (a) a first end surface, (b) a second end surface, and (c) a longitudinal surface extending between the first and second end surfaces. The cladding substantially surrounds the core to form a cladded core. The core may have a first shear-wave propagation velocity ("SWPV"), and the cladding may have a second SWPV. The second SWPV is greater than the first SWPV.

Each of the plurality of waveguides may be substantially fixed to at least one other waveguide, thereby binding the waveguides. The binding operation may be carried out by heating the waveguide to fuse the cladding of at least one waveguide to the cladding of another waveguide. Also, the binding operation may be carried out by potting the waveguides with a suitable potting material placed between the waveguides. Finally, the binding operation may be carried out by placing a band around the plurality of waveguides.

The waveguides may be cut to a desired length. For example, the waveguides may be cut prior to or after the binding operation. In one embodiment of the method, the cutting operation is carried out so that the first end surfaces of the waveguides lie substantially in a plane. Further, the cutting operation may be carried out so that the second end surfaces of the waveguides lie substantially in a different plane.

BRIEF DESCRIPTION OF THE DRAWINGS

For a fuller understanding of the nature and objects of the invention, reference should be made to the accompanying drawings and the subsequent description. Briefly, the drawings are.

FURTHER DESCRIPTION OF THE INVENTION

Figures 1A, 1B, 1C, 1D, 1E:
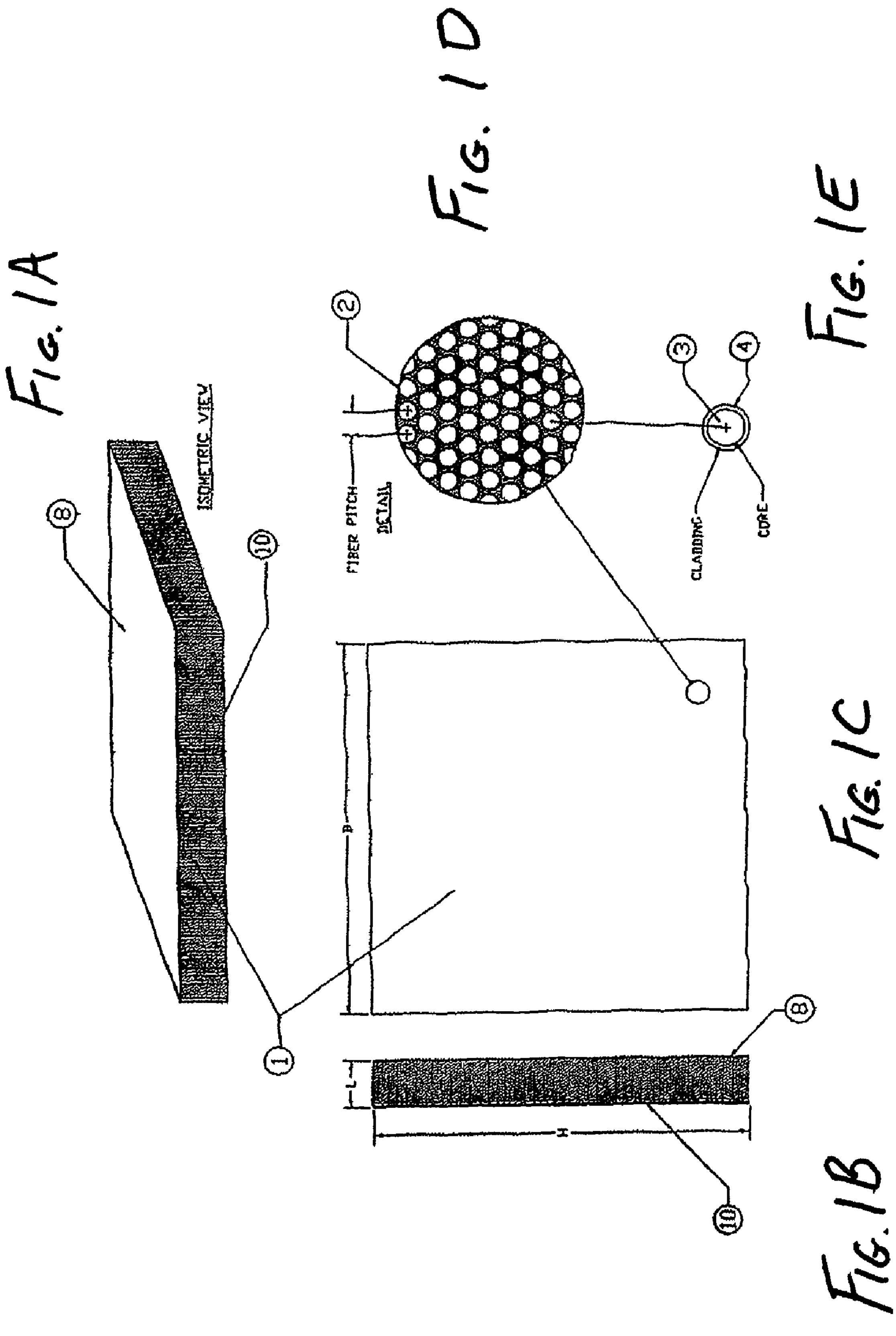
FIG. 1A is an isometric view of an ultrasonic wave transmitter according to the invention.
FIG. 1B is a side view of the transmitter depicted in FIG. 1A.
FIG. 1C is a plan view of the transmitter depicted in FIG. 1A.
FIG. 1D is an enlarged view of a portion of the transmitter depicted in FIG. 1C.
FIG. 1E is an enlarged view of a waveguide depicted in FIG. 1D.

FIGS. 1A through 1E depict an embodiment of the invention in which a plurality of substantially parallel ultrasonic waveguides 1 are held together into a single assembly. The assembly is shown in FIG. 1 as a plate 6 of waveguides 1. The ultrasonic waveguides 1 may be fibers, and may be thought of as conduits that transmit acoustic wave energy, such as ultrasonic energy, from a first end-surface 8 of the waveguide 1 to a second end-surface 10 of the waveguide 1. Each waveguide 1 in the plate 6 may be used to convey a different ultrasonic signal from one side of the plate 6 to the other side. In order to preserve the information being transmitted by the waveguides, the relative positions of the first end-surfaces 8 of the waveguides 1 may be positioned substantially the same as the relative positions of the second end-surfaces 10 of the waveguides 1.

In an embodiment of the invention, an assembly of waveguides 1 is formed so that ultrasonic energy may be conducted from one side of the assembly to the other side. The waveguides 1 may be constructed to have a core 3 material and a cladding 4 material. The core 3 and cladding 4 are substantially solid. The propagation velocity of a shear-wave in the core 3 material should differ from the propagation velocity of a shear-wave in the cladding 4 material so that an ultrasonic wave traveling through the waveguide 1 is substantially contained in the waveguide 1 by means of total internal reflection at the interface of the core 3 and cladding 4. Since ultrasonic energy may be used to transmit information, such as fingerprint information, the invention may be used to transmit information about a pattern (such as a fingerprint) from one side of the plate 6 to another side of the plate 6.

Such a plate 6 may be used, for instance, in ultrasonic fingerprint imaging. In this situation, ultrasonic pulses are reflected from a finger. Generally, the finger is placed on a platen, and when the ultrasonic energy arrives at the finger, at the valleys of the fingerprint all or nearly all of the energy is reflected back. At the ridges of the fingerprint, most of the energy is absorbed by the finger and only a small quantity of ultrasonic energy is reflected back. At the ridge-valley transition region of the fingerprint, the energy reflected back will be between these two values. The detector then measures the amount of energy received, and then a computer translates that value into a grey scale image that is displayed on a monitor. The plate 6 may be placed in the path of the emitted ultrasonic pulse and/or the reflected ultrasonic energy so as to transmit the ultrasonic energy in a manner that minimizes losses and scattering of ultrasonic energy.

Figures 2A, 2B:
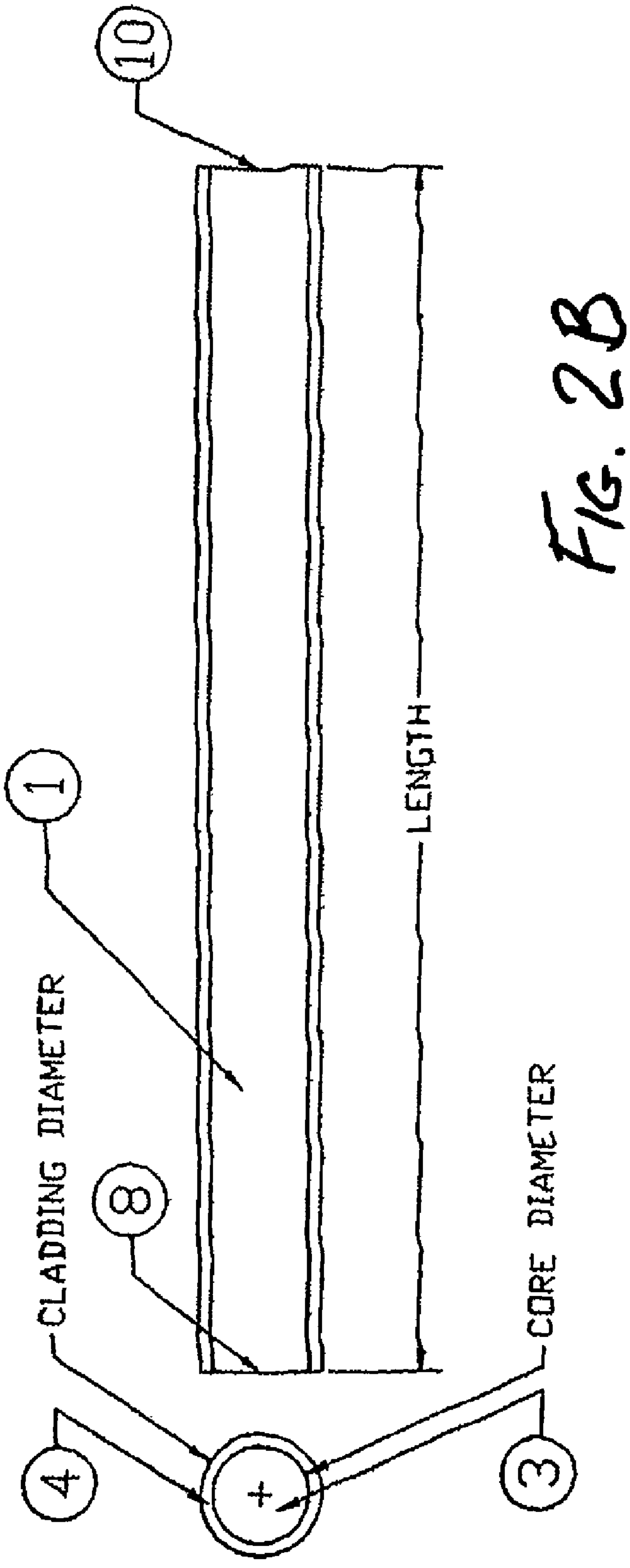
FIG. 2A is an end view of a waveguide.
FIG. 2B is a side view of a waveguide.

Having described the invention in general terms, further details are now provided. Each waveguide 1 has a core 3 and cladding 4. FIGS. 2A and 2B depict a waveguide 1. The materials of the core 3 and cladding 4 are selected so that the shear-wave velocity of the cladding 4 is greater than the shear-wave velocity of the core 3. By carefully selecting the core 3 and cladding 4 materials, sound traveling within the waveguide 1 is substantially confined to the core 3.

Under these conditions, acoustic waves, such as ultrasonic waves, are allowed to propagate along the length of the waveguide 1. The core/cladding interface reflects the shear wave. This condition prevents leakage of the wave energy through the cladding. The greater the differences in shear-wave velocities between the core 3 and cladding 4, the thinner the cladding 4 can be. When ultrasonic energy waves are confined primarily to the core 3 material, external conditions will have little or no significant effect on transmission of the ultrasonic energy Although it would be an easy matter to simply select two materials for the core 3 and cladding 4, manufacturing, chemistry and physics considerations limit the choices. For example, the materials selected for the core 3 and cladding 4 of a waveguide 1 should have a similar softening temperature and uniformity of extrusion. In this manner, the waveguide 1 may be more easily and cheaply manufactured.

Furthermore, in order to propagate through the waveguide 1, the ultrasonic energy should have a wavelength corresponding to a frequency that is at or above a cutoff frequency of the waveguide 1. The cutoff frequency for the waveguide 1 can be determined by:

$$f_c = \frac{V_s}{2d}$$

where "$f_c$" is the cutoff frequency, "$V_s$" is the shear velocity (the velocity perpendicular to the longitudinal velocity vector) of the core 3 and "d" is the diameter of the core 3. Based on the relative differences in shear-wave propagation of the core and cladding materials, the ratio of core 3 diameter to the minimum cladding 4 thickness may be determined. For example, the thickness of the cladding may be determined using Bessel functions, or determined empirically by experimentation.

Figure 5:
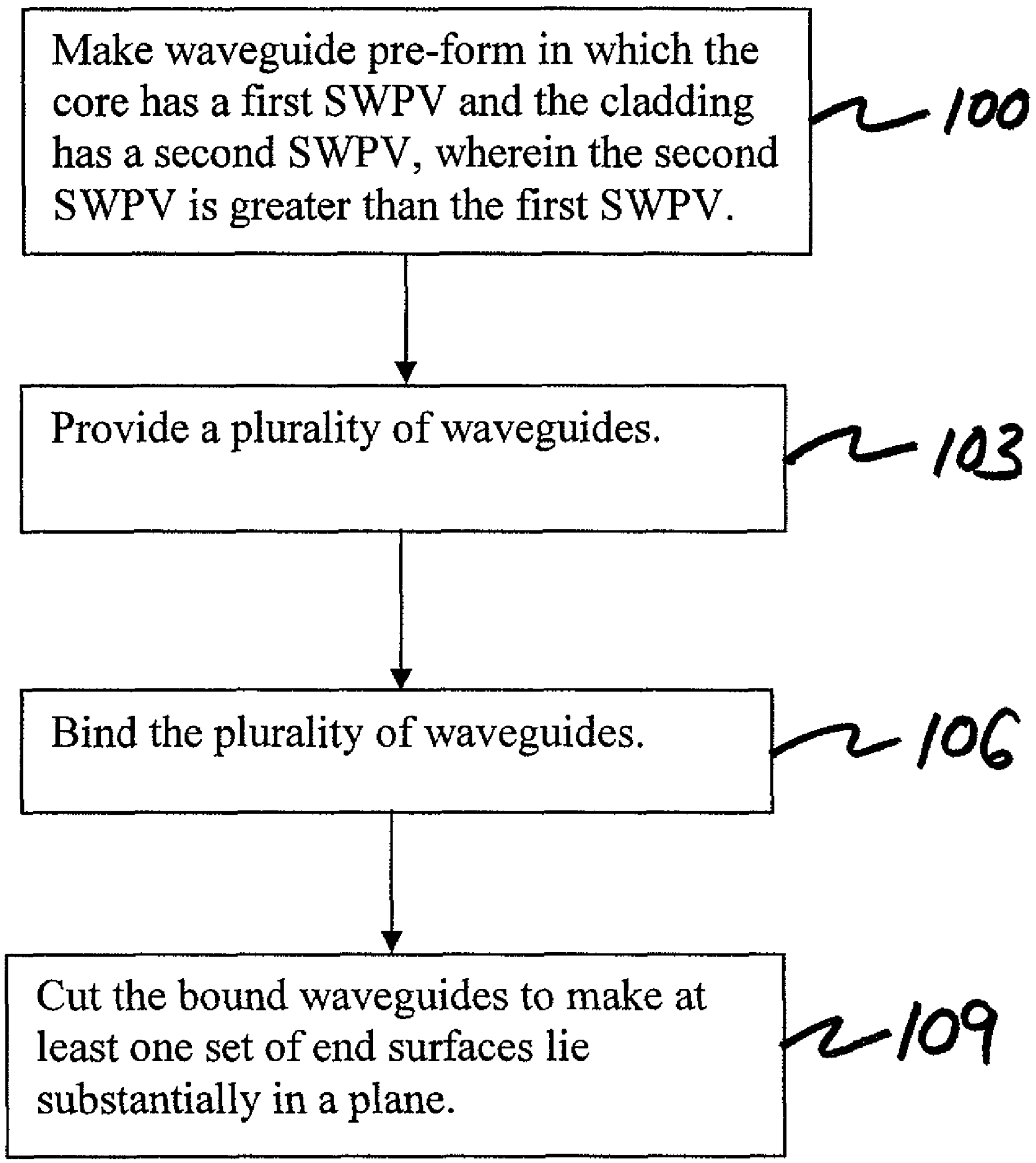
FIG. 5 depicts a method according to the invention.

FIG. 5 depicts a method according to the invention, in which the plurality of waveguides 1 are made into an acoustic wave transmitter. To manufacture a waveguide 1, a waveguide pre-form is made 100. To do so, a cylinder of the core 3 material may be prepared of a nominal diameter. Similarly, a hollow cylinder of the cladding 4 material may be prepared with an inner diameter similar to that of the core 3 and an outer diameter proportional to the core cladding ratio desired by the waveguide designer. A core 3 and cladding 4 may be nested together and heated in an oven until they fuse, thereby forming a waveguide pre-form.

In another method of making a waveguide pre-form, a glass capillary is filled with polystyrene resin. For example, styrene monomer may be wicked in a glass capillary, and the monomer may be polymerized in-situ. In another process, molten polystyrene resin is injected into the glass capillary using an injection molding ram.

Also, a polystyrene capillary may be filled with polymethylmethacrylate resin to form a waveguide pre-form. It will be recognized that a waveguide pre-form may be made by filling a plastic capillary with an appropriate material having the required shear-wave propagation velocity characteristic.

Once the waveguide pre-form is made, the pre-form may be drawn to the desired diameter using standard fiber extrusion and drawing techniques. Such techniques are commonly used to manufacture poly-thread and fiber, such as monofilament fishing line. In manufacturing a waveguide 1, suitable polymers may be selected for the core 3 and cladding 4.

Figure 3A:
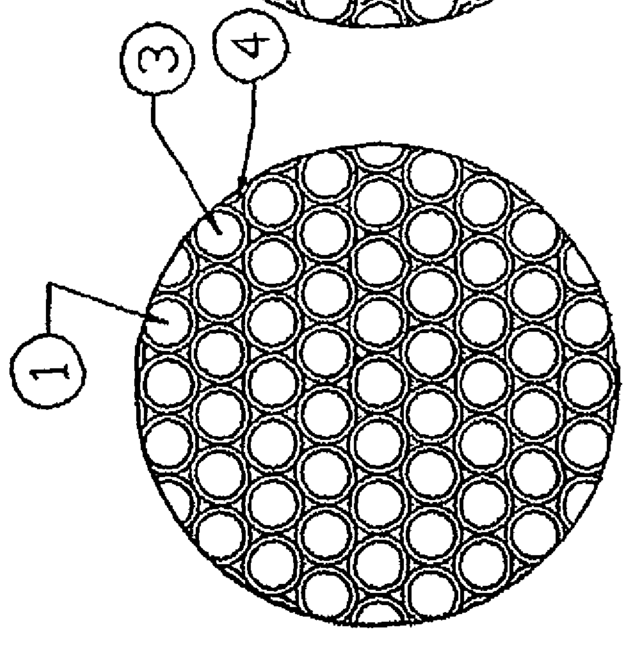
FIG. 3A depicts an assembly of waveguides that have not been fixed relative to each other.
Figure 3B:
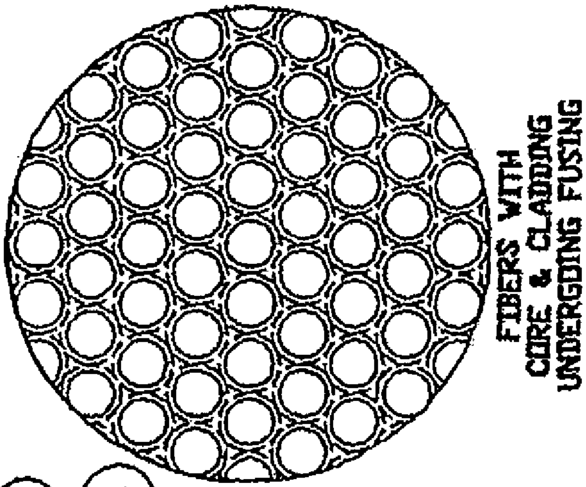
FIG. 3B depicts an assembly of waveguides for which the claddings are beginning to fuse.
Figure 3C:
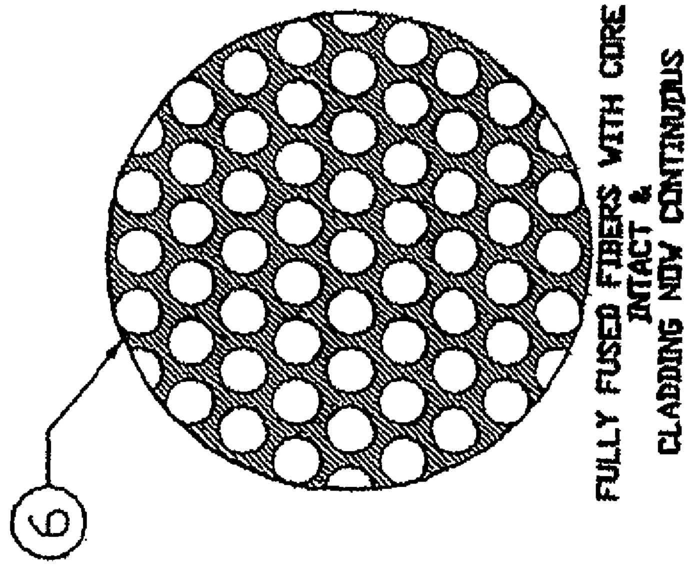
FIG. 3C depicts an assembly of waveguides for which the claddings have fused so as to fix the position of the waveguides relative to each other.

Once the core 3 and cladding 4 have been drawn to the desired diameter, the resulting fiber may be cut into appropriate lengths, to form a plurality of waveguides 1. The cutting operation may be carried out so as to provide a plurality of waveguides having similar lengths. The plurality of waveguides may be provided 103 and carefully placed close to each other in order to provide a bundle of waveguides 1. FIG. 3A depicts a bundle of waveguides 1. To form the plate 6, each waveguide is bound 106 in order to substantially fix each waveguide 1 to at least one of the other waveguides 1 in the bundle. To accomplish this, the bundle may be heated to fuse the claddings 4 to each other, and exclude interstitial air or gases. FIG. 3B depicts the waveguides 1 while the claddings 4 are fusing, and FIG. 3C depicts the waveguides 1 once fusing is complete.

Figures 4A, 4B:
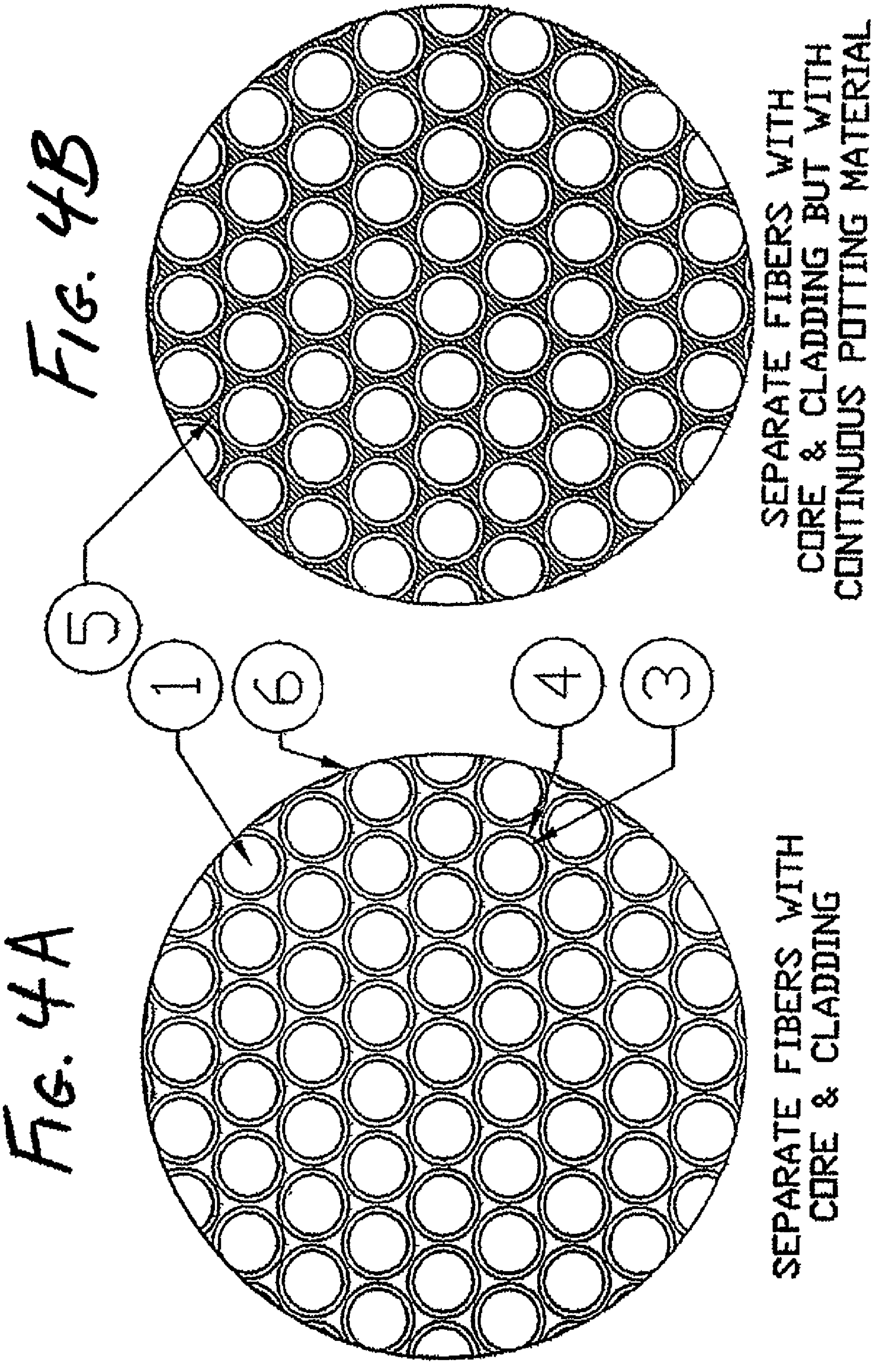
FIG. 4A depicts an assembly of waveguides that have not been fixed relative to each other.
FIG. 4B depicts an assembly of waveguides that have been potted so as to fix the position of the waveguides relative to each other.

Alternatively, the interstices between the waveguides 1 may be filled in order to pot the waveguides 1 by using a suitable potting compound 5, such as a two part curing resin system. Epoxy resin systems or a room-temperature vulcanizable silicone rubber are two widely known means that may be used as a potting compound 5. FIG. 4A depicts the waveguides 1 prior to potting, and FIG. 4B depicts the waveguides 1 after potting.

In lieu of (or in addition to) potting or fusing the waveguides 1, the waveguides 1 may be mechanically constrained so that the end surfaces 8, 10 of the waveguides 1 are not permitted to move relative to each other. For example, a tightly drawn band may be used to mechanically constrain the waveguides 1.

Once bundled together, the resulting device may be thought of as an assembly having substantially parallel waveguides 1, each having a position that is fixed relative to the other waveguides 1 in the assembly. The assembly of waveguides 1 may be cut 109 perpendicular to the longitudinal axes of the waveguides 1 to provide a plate 6 having a desired thickness. In this fashion, the first end-surfaces 8 may lie substantially in a plane. Further, the second end-surfaces 10 may lie substantially in a plane. The end surfaces 8, 10 of the waveguides 1 may be polished to a suitable flatness to prevent diffraction losses as the ultrasonic energy enters and leaves the waveguides 1.

One set of materials that may offer the qualities needed to create an ultrasonic waveguide 1 and ultimately the plate 6 may be Polymethylmethacrylate ("PMMA") for the core and polystyrene ("PS") for the cladding. Another polymer pair that may be used is polyethylene for the core and polycarbonate for the cladding, although this pair may be more difficult to process because the melting points of these materials are not similar. Further, polystyrene may be used for the core and glass may be used for the cladding. These are only examples of the types of materials that may be used. Other polymer or copolymer pairs can be successfully used to create a suitable ultrasonic waveguide 1, and subsequently the plate 6.

The plate 6 offers an inexpensive means of transmitting acoustic wave energy from one place to another, and does so with a minimum of signal loss. The plate 6 may be used to transmit ultrasonic energy from an ultrasonic wave emitter, to a finger, and/or from a finger, to an ultrasonic wave receiver, as part of a system for producing a fingerprint image corresponding to the finger. In one such system, an ultrasonic wave guide plate 6 is provided and a finger is placed proximate to a first end surface of the waveguides 1. Ultrasonic energy may be provided by an emitter, and the energy may travel to the finger at least in part via the plate 6. Some of the energy provided to the finger may be reflected back toward the plate 6. The reflected ultrasonic energy from the finger may be received at first end-surfaces 8 of the waveguides 1 and transmitted via the waveguides 1 to the second end-surfaces of the waveguides 1. The ultrasonic energy leaving the second end-surfaces 10 of the waveguides 1 may be provided to a receiver. The receiver may detect the ultrasonic energy received at various locations on the receiver, and convert the ultrasonic energy to one or more electric signals that are indicative of the strength of the received ultrasonic energy signal. The electric signals may be provided to a computer, which has software suitable for interpreting the electric signal and to generate an image of the fingerprint on a monitor.

Although the present invention has been described with respect to one or more particular embodiments, it will be understood that other embodiments of the present invention may be made without departing from the spirit and scope of the present invention. Hence, the present invention is deemed limited only by the appended claims and the reasonable interpretation thereof.

What is claimed is:

1. An acoustic wave transmitter, comprising:

a plurality of waveguides, each waveguide having a core and cladding, the core having (a) a first end surface, (b) a second end surface, and (c) a longitudinal surface extending between the first and second end surfaces, the longitudinal surface being substantially surrounded by the cladding to form a cladded core, wherein the core is a material having a first shear-wave propagation velocity ("SWPV") and the core is selected from the group consisting of polystyrene and polymethylmethacrylate, and the cladding is a material having a second shear-wave propagation velocity and the cladding is selected from the group consisting of polystyrene, polycarbonate and glass, and wherein the second SWPV is greater than the first SWPV;

a binder holding the waveguides so as to substantially fix each waveguide relative to the other waveguides.

2. The wave transmitter of claim 1, wherein the waveguides are substantially the same length.

3. The wave transmitter of claim 1, wherein the first end surfaces of the waveguides lie substantially in a plane.

4. The wave transmitter of claim 1, wherein the second end surfaces of the waveguides lie substantially in a plane.

5. The wave transmitter of claim 1, wherein the binder is a material substantially the same as the material used for the cladding.

6. The wave transmitter of claim 5, wherein the cladding material also serves as the binder, and the binder has been formed by fusing the cladding of a first waveguide to the cladding of a second waveguide.

7. The wave transmitter of claim 1, wherein the binder has been potted to interstices between the waveguides.

8. The wave transmitter of claim 1, wherein the core is polymethylmethacrylate and the cladding is polystyrene.

9. The wave transmitter of claim 1, wherein the core is polystyrene and the cladding is glass.

10. A method of making an acoustic wave transmitter, comprising:

providing a plurality of waveguides each having a core and cladding, wherein, (a) the core has (a) a first end surface, (b) a second end surface, and (c) a longitudinal surface extending between the first and second end surfaces, the core having a first shear-wave propagation velocity ("SWPV") and the core is selected from the group consisting of polystyrene and polymethylmethacrylate;

(b) the cladding substantially surrounds the core to form a cladded core, the cladding having a second SWPV and the cladding is selected from the group consisting of polystyrene, polycarbonate and glass, wherein the second SWPV is greater than the first SWPV;

binding the waveguides so as to substantially fix each waveguide relative to the other waveguides.

11. The method of claim 10, wherein the waveguides that are provided are made substantially the same length by cutting the waveguides to a desired length.

12. The method of claim 10, wherein binding is carried out by heating the wave guides to fuse the cladding of at least one waveguide to the cladding of another waveguide.

13. The method of claim 10, wherein binding is carried out by placing a potting material between the waveguides.

14. The method of claim 10, wherein binding is carried out by placing a band around the plurality of waveguides.

15. The method of claim 10, further comprising cutting the bound waveguides so that the first end surfaces of the waveguides lie substantially in a plane.

16. The method of claim 15, further comprising cutting the bound waveguides so that the second end surfaces of the waveguides lie substantially in a plane.

17. The method of claim 10, wherein the core is polymethylmethacrylate and the cladding is polystyrene.

18. The method of claim 10, wherein the core is polystyrene and the cladding is glass.

* * * * *